United States Patent
Hatayama et al.

(10) Patent No.: US 12,302,621 B2
(45) Date of Patent: May 13, 2025

(54) SILICON CARBIDE SEMICONDUCTOR DEVICE AND METHOD OF MANUFACTURING SILICON CARBIDE SEMICONDUCTOR DEVICE

(71) Applicant: SUMITOMO ELECTRIC INDUSTRIES, LTD., Osaka (JP)

(72) Inventors: Tomoaki Hatayama, Tsukuba (JP); Takeyoshi Masuda, Tsukuba (JP); Shinsuke Harada, Tsukuba (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 387 days.

(21) Appl. No.: 17/771,828

(22) PCT Filed: Oct. 9, 2020

(86) PCT No.: PCT/JP2020/038231
§ 371 (c)(1),
(2) Date: Apr. 26, 2022

(87) PCT Pub. No.: WO2021/085078
PCT Pub. Date: May 6, 2021

(65) Prior Publication Data
US 2022/0376065 A1 Nov. 24, 2022

(30) Foreign Application Priority Data
Oct. 29, 2019 (JP) .................... 2019-196257

(51) Int. Cl.
*H10D 64/23* (2025.01)
*H10D 62/13* (2025.01)
(Continued)

(52) U.S. Cl.
CPC ......... *H10D 64/256* (2025.01); *H10D 62/157* (2025.01); *H10D 62/393* (2025.01); *H10D 62/8325* (2025.01)

(58) Field of Classification Search
CPC ........... H01L 29/41766; H01L 29/0878; H01L 29/1095; H01L 29/1608; H01L 22/12;
(Continued)

(56) References Cited

U.S. PATENT DOCUMENTS 9,679,971 B2 * 6/2017 Shimizu .............. H01L 29/7813
2003/0148559 A1 8/2003 Onishi et al.
(Continued)

FOREIGN PATENT DOCUMENTS

JP 2014-099483 A 5/2014
JP 2016-006900 A 1/2016
(Continued)

OTHER PUBLICATIONS

Kazuto Takao et al., "High-Power Converters with High Switching Frequency Using Hybrid Pairs of SiC-PiN Diodes and Si-IEGTs", Toshiba Review, vol. 66, No. 5, 2011, with English Abstract (cited in specification).

*Primary Examiner* — Allison Bernstein
(74) *Attorney, Agent, or Firm* — Renner, Otto, Boisselle & Sklar, LLP

(57) ABSTRACT

A silicon carbide semiconductor device includes a silicon carbide substrate, a first electrode, and a second electrode. The silicon carbide substrate has a first main surface, a second main surface, a first impurity region, a second impurity region, and a third impurity region. The first electrode is in contact with each of the second impurity region and the third impurity region on the first main surface. The second electrode is in contact with the first impurity region on the second main surface. The second (Continued)

impurity region includes a first region and a second region disposed between the first region and the second main surface and in contact with the first region. An impurity concentration of the first region is more than or equal to $6\times10^{16}$ cm$^{-3}$.

27 Claims, 17 Drawing Sheets

(51) Int. Cl.
  *H10D 62/17* (2025.01)
  *H10D 62/832* (2025.01)
(58) Field of Classification Search
  CPC . H01L 29/32; H01L 29/0634; H01L 29/0688; H01L 29/0886; H01L 29/66068; H01L 29/7802; H01L 29/7813; H01L 29/0684; H01L 29/7828; H10D 64/256; H10D 62/157; H10D 62/393; H10D 62/8325; H10D 30/0245; H10D 30/473; H10D 62/138; H10D 62/142; H10D 62/364; H10D 84/619; A01N 1/10; A23B 2/746; H10F 39/811; H10F 77/1465; H10H 29/853
  See application file for complete search history.

(56) References Cited

U.S. PATENT DOCUMENTS

| | | | |
|---|---|---|---|
| 2015/0214049 A1* | 7/2015 | Kawada | H01L 21/02378 117/88 |
| 2016/0254148 A1 | 9/2016 | Kitamura | |
| 2017/0077239 A1 | 3/2017 | Shimizu et al. | |
| 2019/0074360 A1* | 3/2019 | Hiyoshi | H01L 29/1095 |
| 2023/0261042 A1* | 8/2023 | Masuda | H01L 29/7813 257/77 |

FOREIGN PATENT DOCUMENTS

| | | |
|---|---|---|
| JP | 2019-057629 A | 4/2019 |
| JP | 2019-520703 A | 7/2019 |
| JP | 2019-526963 A | 9/2019 |
| WO | 2015/064256 A1 | 5/2015 |
| WO | 2017/209825 A1 | 12/2017 |
| WO | 2018/030990 A1 | 2/2018 |

* cited by examiner

SILICON CARBIDE SEMICONDUCTOR DEVICE AND METHOD OF MANUFACTURING SILICON CARBIDE SEMICONDUCTOR DEVICE

TECHNICAL FIELD

The present disclosure relates to a silicon carbide semiconductor device and a method of manufacturing the silicon carbide semiconductor device. The present application claims a priority based on Japanese Patent Application No. 2019-196257 filed on Oct. 29, 2019, the entire content of which is incorporated herein by reference.

BACKGROUND ART

The IV characteristic of a SiC-PiN diode is described in Kazuto Takao et al., "High-Power Converters with High Switching Frequency Using Hybrid Pairs of SiC-PiN Diodes and Si-IEGTs", Toshiba Review, Volume 66, No. 5, 2011 (NPL 1).

CITATION LIST

NPL 1: Kazuto Takao et al., "High-Power Converters with High Switching Frequency Using Hybrid Pairs of SiC-PiN Diodes and Si-IEGTs", Toshiba Review, Volume 66, No. 5, 2011

SUMMARY OF INVENTION

A silicon carbide semiconductor device according to the present disclosure includes a silicon carbide substrate, a first electrode, and a second electrode. The silicon carbide substrate has a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impurity region so as to be separated from the first impurity region, the third impurity region having the first conductivity type. The first electrode is in contact with each of the second impurity region and the third impurity region on the first main surface. The second electrode is in contact with the first impurity region on the second main surface. The second impurity region includes a first region and a second region disposed between the first region and the second main surface and in contact with the first region. An impurity concentration of the first region is more than or equal to $6\times10^{16}$ cm$^{-3}$.

A silicon carbide semiconductor device according to the present disclosure includes a silicon carbide substrate, a first electrode, and a second electrode. The silicon carbide substrate has a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impurity region so as to be separated from the first impurity region, the third impurity region having the first conductivity type. The first electrode is in contact with each of the second impurity region and the third impurity region on the first main surface. The second electrode is in contact with the first impurity region on the second main surface. The second impurity region includes a first region and a second region disposed between the first region and the second main surface and in contact with the first region. A point defect density of the first region is more than or equal to $6\times10^{12}$ cm$^{-3}$.

A method of manufacturing a silicon carbide semiconductor device according to the present disclosure includes the following steps. A silicon carbide substrate is prepared which has a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impurity region so as to be separated from the first impurity region, the third impurity region having the first conductivity type. A first electrode is formed in contact with each of the second impurity region and the third impurity region on the first main surface. A second electrode is formed in contact with the first impurity region on the second main surface. The second impurity region includes a first region and a second region disposed between the first region and the second main surface and in contact with the first region. An impurity concentration of the first region is more than or equal to $6\times10^{16}$ cm$^{-3}$. The first region is formed by ion implantation.

DETAILED DESCRIPTION

Figure 1:
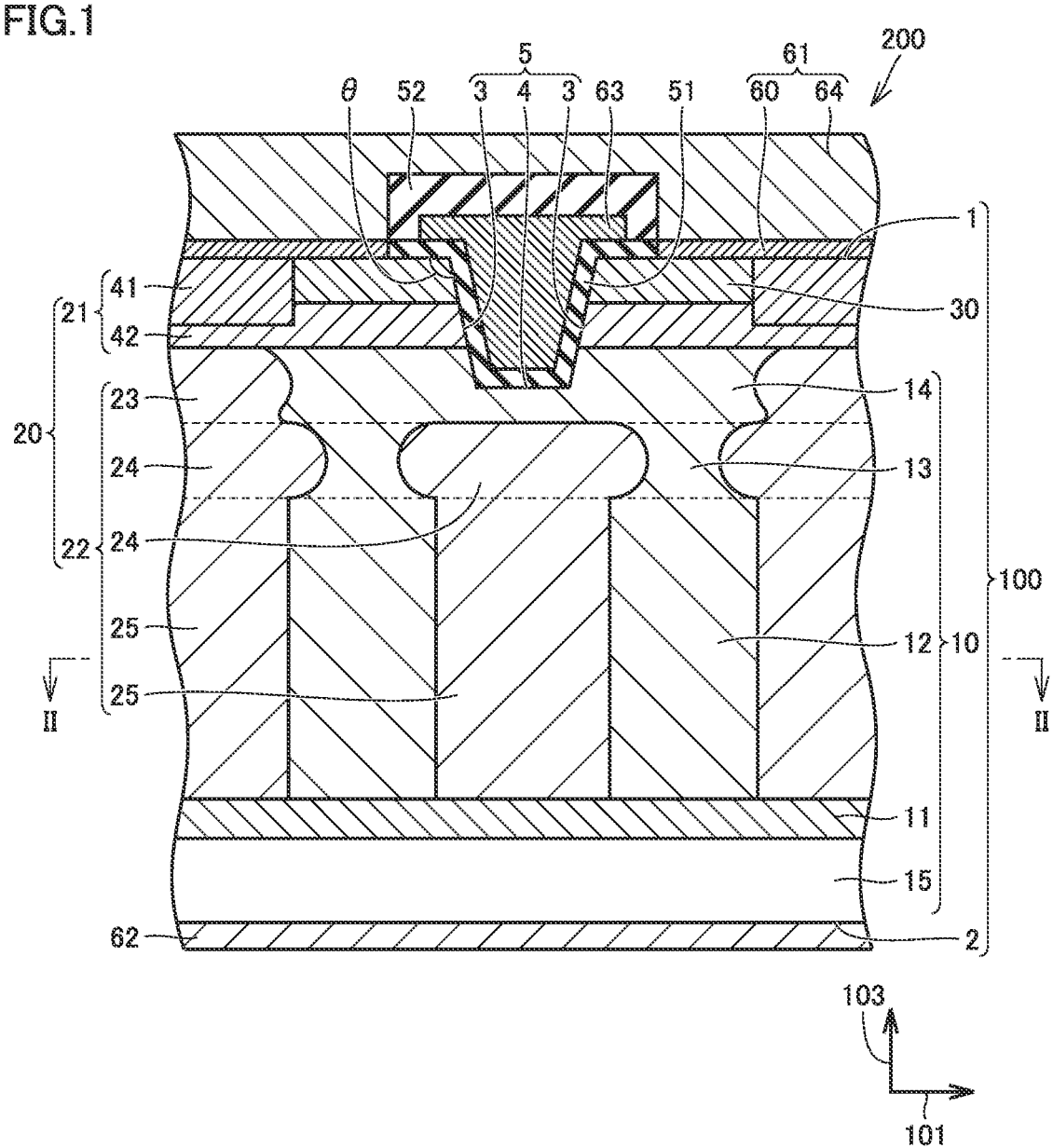
FIG. 1 is a schematic cross sectional view showing a configuration of a silicon carbide semiconductor device according to a first embodiment.

Problem to be Solved by the Present Disclosure

An object of the present disclosure is to provide a silicon carbide semiconductor device and a method of manufacturing the silicon carbide semiconductor device so as to suppress a diode characteristic from being changed by a temperature.

Advantageous Effect of the Present Disclosure

According to the present disclosure, there can be provided a silicon carbide semiconductor device and a method of manufacturing the silicon carbide semiconductor device so as to suppress a diode characteristic from being changed by a temperature.

DESCRIPTION OF EMBODIMENTS

First, embodiments of the present disclosure are listed and described. Regarding crystallographic indications in the present specification, an individual orientation is represented by [ ], a group orientation is represented by < >, and an individual plane is represented by ( ), and a group plane is represented by { }. A crystallographically negative index is normally expressed by putting "−" (bar) above a numeral; however, in the present specification, the crystallographically negative index is expressed by putting a negative sign before the numeral.

(1) A silicon carbide semiconductor device 200 according to the present disclosure includes a silicon carbide substrate 100, a first electrode 61, and a second electrode 62. Silicon carbide substrate 100 has a first main surface 1, a second main surface 2, a first impurity region 10, a second impurity region 20, and a third impurity region 30, second main surface 2 being opposite to first main surface 1, first impurity region 10 constituting at least a portion of second main surface 2, first impurity region 10 having a first conductivity type, second impurity region 20 constituting at least a portion of first main surface 1, second impurity region 20 being provided in contact with first impurity region 10, second impurity region 20 having a second conductivity type different from the first conductivity type, third impurity region 30 being provided in contact with second impurity region 20 so as to be separated from first impurity region 10, third impurity region 30 having the first conductivity type. First electrode 61 is in contact with each of second impurity region 20 and third impurity region 30 on first main surface 1. Second electrode 62 is in contact with first impurity region 10 on second main surface 2. Second impurity region 20 includes a first region 21 and a second region 22 disposed between first region 21 and second main surface 2 and in contact with first region 21. An impurity concentration of first region 21 is more than or equal to $6 \times 10^{16}$ cm$^{-3}$.

(2) In accordance with silicon carbide semiconductor device 200 according to (1), an impurity concentration of second region 22 may be more than or equal to $6 \times 10^{16}$ cm$^{-3}$.

(3) A silicon carbide semiconductor device 200 according to the present disclosure includes a silicon carbide substrate 100, a first electrode 61, and a second electrode 62. Silicon carbide substrate 100 has a first main surface 1, a second main surface 2, a first impurity region 10, a second impurity region 20, and a third impurity region 30, second main surface 2 being opposite to first main surface 1, first impurity region 10 constituting at least a portion of second main surface 2, first impurity region 10 having a first conductivity type, second impurity region 20 constituting at least a portion of first main surface 1, second impurity region 20 being provided in contact with first impurity region 10, second impurity region 20 having a second conductivity type different from the first conductivity type, third impurity region 30 being provided in contact with second impurity region 20 so as to be separated from first impurity region 10, third impurity region 30 having the first conductivity type. First electrode 61 is in contact with each of second impurity region 20 and third impurity region 30 on first main surface 1. Second electrode 62 is in contact with first impurity region 10 on second main surface 2. Second impurity region 20 includes a first region 21 and a second region 22 disposed between first region 21 and second main surface 2 and in contact with first region 21. A point defect density of first region 21 is more than or equal to $6 \times 10^{12}$ cm$^{-3}$.

(4) In accordance with silicon carbide semiconductor device 200 according to (3), the point defect density of first region 21 may be less than or equal to $1 \times 10^{14}$ cm$^{-3}$.

(5) In accordance with silicon carbide semiconductor device 200 according to any one of (1) to (4), silicon carbide semiconductor device 200 may be a planar type.

(6) In accordance with silicon carbide semiconductor device 200 according to any one of (1) to (4), a trench 5 may be provided in silicon carbide substrate 100. Trench 5 may have a side surface 3 in contact with each of first impurity region 10, second impurity region 20, and third impurity region 30, and a bottom surface 4 contiguous to side surface 3 and in contact with first impurity region 10.

(7) In accordance with silicon carbide semiconductor device 200 according to (6), in a cross section perpendicular to first main surface 1, trench 5 may have a U-shape.

(8) In accordance with silicon carbide semiconductor device 200 according to (6), in a cross section perpendicular to first main surface 1, trench 5 may have a V-shape.

(9) In accordance with silicon carbide semiconductor device 200 according to any one of (1) to (8), first main surface 1 may be a (000-1) plane or a plane inclined at an angle of less than or equal to 8° with respect to the (000-1) plane.

(10) In accordance with silicon carbide semiconductor device 200 according to any one of (1) to (9), the impurity concentration of first region 21 may be more than an impurity concentration of second region 22.

(11) In accordance with silicon carbide semiconductor device 200 according to (10), the impurity concentration of first region 21 may be less than or equal to $1 \times 10^{19}$ cm$^{-3}$.

(12) A method of manufacturing a silicon carbide semiconductor device 200 according to the present disclosure includes the following steps. A silicon carbide substrate 100 is prepared which has a first main surface 1, a second main surface 2, a first impurity region 10, a second impurity region 20, and a third impurity region 30, second main surface 2 being opposite to first main surface 1, first impurity region 10 constituting at least a portion of second main surface 2, first impurity region 10 having a first conductivity type, second impurity region 20 constituting at least a portion of first main surface 1, second impurity region 20 being provided in contact with first impurity region 10, second impurity region 20 having a second conductivity type different from the first conductivity type, third impurity region 30 being provided in contact with second impurity region 20 so as to be separated from first impurity region 10, third impurity region 30 having the first conductivity type. A first electrode 61 is formed in contact with each of second impurity region 20 and third impurity region 30 on first main surface 1. A second electrode 62 is formed in contact with first impurity region 10 on second main surface 2. Second impurity region 20 includes a first region 21 and a second region 22 disposed between first region 21 and second main surface 2 and in contact with first region 21. An impurity concentration of first region 21 is more than or equal to $6 \times 10^{16}$ cm$^{-3}$. First region 21 is formed by ion implantation.

(13) In accordance with the method of manufacturing silicon carbide semiconductor device 200 according to (12), second region 22 may be formed by ion implantation.

(14) In accordance with the method of manufacturing silicon carbide semiconductor device 200 according to (12) or (13), first impurity region 10 may be formed by epitaxial growth under a temperature condition of more than or equal to 1500° C. and less than or equal to 1750° C.

(15) In accordance with the method of manufacturing silicon carbide semiconductor device 200 according to any one of (12) to (14), the preparing of silicon carbide substrate 100 may include performing activation annealing. The performing of the activation annealing may be performed under a temperature condition of more than or equal to 1600° C. and less than or equal to 1850° C.

Details of Embodiments of the Present Disclosure

Hereinafter, the embodiments of the present disclosure will be described in detail. In the below description, the same or corresponding elements are denoted by the same reference characters, and will not be described repeatedly.

First Embodiment

First, a configuration of a silicon carbide semiconductor device 200 according to a first embodiment will be described. FIG. 1 is a schematic cross sectional view showing the configuration of silicon carbide semiconductor device 200 according to the first embodiment.

As shown in FIG. 1, silicon carbide semiconductor device 200 according to the first embodiment is a trench type MOSFET, and mainly has a silicon carbide substrate 100, a gate electrode 63, a gate insulation film 51, an separating insulation film 52, a first electrode 61, and a second electrode 62. Silicon carbide substrate 100 has a first main surface 1 and a second main surface 2 opposite to first main surface 1.

First main surface 1 is, for example, a {0001} plane or a plane angled off by less than or equal to 8° with respect to the {0001} plane. Specifically, first main surface 1 is, for example, a (000-1) plane or a plane inclined at an angle of less than or equal to 8° with respect to the (000-1) plane. First main surface 1 may be, for example, a (0001) plane or a plane inclined at an angle of less than or equal to 8° with respect to the (0001) plane.

As shown in FIG. 1, silicon carbide substrate 100 includes a first impurity region 10, a second impurity region 20, and a third impurity region 30. First impurity region 10 includes an n type impurity that can impart n type conductivity, such as N (nitrogen). First impurity region 10 has, for example, n type conductivity (first conductivity type). First impurity region 10 constitutes at least a portion of second main surface 2. In other words, first impurity region 10 may constitute a whole of second main surface 2, or may constitute a portion of second main surface 2.

First impurity region 10 has a silicon carbide single-crystal substrate 15, a buffer layer 11, first super junction regions 12, first joint regions 13, and a current spreading region 14. Silicon carbide single-crystal substrate 15 constitutes second main surface 2. Silicon carbide single-crystal substrate 15 is composed of, for example, hexagonal silicon carbide having a polytype of 4H. Buffer layer 11 is provided on silicon carbide single-crystal substrate 15. Buffer layer 11 is in contact with silicon carbide single-crystal substrate 15.

Each of first super junction regions 12 is provided on buffer layer 11. First super junction region 12 is in contact with buffer layer 11. In a first direction 101, the width of first super junction region 12 is smaller than the width of buffer layer 11. The height of first super junction region 12 in a third direction 103 may be larger than the width of first super junction region 12 in first direction 101. The concentration of the n type impurity in first super junction region 12 may be less than the concentration of the n type impurity in buffer layer 11.

Each of first joint regions 13 is provided on a corresponding one of first super junction regions 12. First joint region 13 is in contact with first super junction region 12. First joint region 13 may be narrowed such that the width of the central portion of first joint region 13 is smaller than the width of each of the upper and lower portions of first joint region 13. Current spreading region 14 is provided on first joint region 13. Current spreading region 14 is in contact with first joint region 13. Current spreading region 14 is in contact with each of a bottom surface 4 and a side surface 3 of a trench 5.

The impurity concentration of first impurity region 10 is, for example, more than or equal to $6\times10^{16}$ cm$^{-3}$. Specifically, the concentration of the n type impurity in first super junction region 12 of first impurity region 10 is more than or equal to $6\times10^{16}$ cm$^{-3}$, for example. The concentration of the n type impurity in first super junction region 12 of first impurity region 10 may be more than or equal to $8\times10^{16}$ cm$^{-3}$, or may be more than or equal to $10\times10^{16}$ cm$^{-3}$, for example.

The concentration of the n type impurity in first joint region 13 of first impurity region 10 is, for example, more than or equal to $6\times10^{16}$ cm$^{-3}$. The concentration of the n type impurity in current spreading region 14 of first impurity region 10 is, for example, more than or equal to $6\times10^{16}$ cm$^{-3}$. The concentration of the n type impurity in each of first super junction region 12, first joint region 13, and current spreading region 14 may be more than or equal to $6\times10^{16}$ cm$^{-3}$, for example.

Second impurity region 20 includes a p type impurity that can impart p type conductivity, such as Al (aluminum). Second impurity region 20 has p type conductivity (second conductivity type) different from n type conductivity. Second impurity region 20 is provided in contact with first impurity region 10. Second impurity region 20 and first impurity region 10 constitute a PN diode. Second impurity region 20 constitutes at least a portion of first main surface 1. In other words, second impurity region 20 may constitute a whole of first main surface 1, or may constitute a portion of first main surface 1.

Second impurity region 20 has a first region 21 and a second region 22. Second region 22 is disposed between first region 21 and second main surface 2. Second region 22 is in contact with first region 21. First region 21 constitutes at least a portion of first main surface 1. First region 21 may have, for example, a first portion 41 and a second portion 42. First portion 41 is disposed on second portion 42. Second portion 42 is in contact with first portion 41. The concentration of the p type impurity in first portion 41 may be more than the concentration of the p type impurity in second portion 42. Second portion 42 is, for example, a channel layer. First region 21 may have no first portion 41. Second region 22 may be in contact with buffer layer 11.

Second region 22 has second super junction regions 25, second joint regions 24, and third joint regions 23. Each of second super junction regions 25 is provided on buffer layer 11. Second super junction region 25 is in contact with buffer layer 11. In first direction 101, the width of second super junction region 25 is smaller than the width of buffer layer 11. The height of second super junction region 25 in third direction 103 may be larger than the width of second super junction region 25 in first direction 101.

First super junction region 12 and second super junction region 25 constitute a super junction. First super junction region 12 is in contact with second super junction region 25. In first direction 101, first super junction regions 12 and second super junction regions 25 are alternately disposed. The concentration of the p type impurity in each of second super junction regions 25 may be about the same as the concentration of the n type impurity in each of first super junction regions 12. In first direction 101, the width of second super junction region 25 may be about the same as the width of first super junction region 12.

Each of second joint regions 24 is provided on a corresponding one of second super junction regions 25. Second joint region 24 is in contact with second super junction region 25. Second joint region 24 may be expanded such that the width of the central portion of second joint region 24 is larger than the width of each of the upper and lower portions of second joint region 24. In first direction 101, the maximum width of second joint region 24 may be larger than the width of second super junction region 25. Second joint region 24 is in contact with first joint region 13. In first direction 101, second joint regions 24 and first joint regions 13 are alternately disposed.

Each of third joint regions 23 is provided on a corresponding one of second joint regions 24. Third joint region 23 is in contact with each of second joint region 24 and first region 21. In third direction 103, third joint region 23 is located between second joint region 24 and first region 21. In first direction 101, third joint region 23 is in contact with current spreading region 14.

The impurity concentration of second region 22 is more than or equal to $6\times10^{16}$ cm$^{-3}$. Specifically, the concentration of the p type impurity in second super junction region 25 of second region 22 is more than or equal to $6\times10^{16}$ cm$^{-3}$. The concentration of the p type impurity in second super junction region 25 of second region 22 may be more than or equal to $8\times10^{16}$ cm$^{-3}$, or may be more than or equal to $10\times10^{16}$ cm$^{-3}$. The upper limit of the concentration of the p type impurity in second super junction region 25 of second region 22 is not particularly limited, and may be less than or equal to $6\times10^{18}$ cm$^{-3}$, for example.

The concentration of the p type impurity in second joint region 24 of second region 22 is, for example, more than or equal to $6\times10^{16}$ cm$^{-3}$. The concentration of the p type impurity in third joint region 23 of second region 22 is, for example, more than or equal to $6\times10^{16}$ cm$^{-3}$. The concentration of the p type impurity in each of second super junction region 25, second joint region 24, and third joint region 23 may be more than or equal to $6\times10^{16}$ cm$^{-3}$, for example.

Third impurity region 30 is provided in contact with second impurity region 20 so as to be separated from first impurity region 10. Third impurity region 30 includes an n type impurity that can impart n type conductivity, such as P (phosphorus). Third impurity region 30 has, for example, n type conductivity. Third impurity region 30 is, for example, a source region. Third impurity region 30 may constitute a portion of first main surface 1. The concentration of the n type impurity in third impurity region 30 may be more than the concentration of the p type impurity in second portion 42.

The impurity concentration of first region 21 is more than or equal to $6\times10^{16}$ cm$^{-3}$. Specifically, the concentration of the p type impurity in first region 21 is more than or equal to $6\times10^{16}$ cm$^{-3}$. The impurity concentration of first region 21 may be more than the impurity concentration of second region 22. Specifically, the concentration of the p type impurity in second portion 42 of first region 21 may be more than the concentration of the p type impurity in second region 22. The impurity concentration of first region 21 may be less than or equal to $1\times10^{19}$ cm$^{-3}$. Specifically, the concentration of the p type impurity in second portion 42 of first region 21 may be less than or equal to $1\times10^{19}$ cm$^{-3}$. The concentration of the p type impurity in second portion 42 of first region 21 may be less than or equal to $8\times10^{18}$ cm$^{-3}$, or may be less than or equal to $6\times10^{18}$ cm$^{-3}$. The lower limit of the concentration of the p type impurity in second portion 42 of first region 21 is not particularly limited, and may be more than or equal to $6\times10^{17}$ cm$^{-3}$, for example.

Trench 5 is provided in silicon carbide substrate 100. Trench 5 is opened in first main surface 1. Trench 5 has side surface 3 and bottom surface 4. Bottom surface 4 is contiguous to side surface 3. Side surface 3 is in contact with each of first impurity region 10, second impurity region 20, and third impurity region 30. Specifically, side surface 3 is in contact with each of current spreading region 14, second portion 42, and third impurity region 30. Bottom surface 4 is in contact with first impurity region 10. Specifically, bottom surface 4 is in contact with current spreading region 14.

In a cross section perpendicular to first main surface 1, trench 5 may have a V-shape. The expression "trench 5 has a V-shape" means that an angle θ formed between side surface 3 of trench 5 and first main surface 1 is more than 90° and less than 180°. Angle θ may be, for example, more than or equal to 115° and less than or equal to 135°.

Gate insulation film 51 is composed of, for example, silicon dioxide. Gate insulation film 51 is disposed inside trench 5. Gate insulation film 51 is in contact with each of first impurity region 10, second impurity region 20, and third impurity region 30 on side surface 3 of trench 5. Gate insulation film 51 is in contact with current spreading region 14 on bottom surface 4 of trench 5. A channel can be formed in second portion 42 of second impurity region 20 that is in contact with gate insulation film 51. Gate insulation film 51 is in contact with third impurity region 30 on first main surface 1. The thickness of gate insulation film 51 is, for example, more than or equal to 40 nm and less than or equal to 150 nm.

Gate electrode 63 is provided on gate insulation film 51. Gate electrode 63 is disposed in contact with gate insulation film 51. At least a portion of gate electrode 63 is disposed inside trench 5. Gate electrode 63 is composed of, for example, an electric conductor such as polysilicon doped with an impurity.

Separating insulation film 52 is provided to cover gate electrode 63. Separating insulation film 52 is in contact with each of gate electrode 63 and gate insulation film 51. Separating insulation film 52 is constituted of, for example, a NSG (None-doped Silicate Glass) film, a PSG (Phosphorus Silicate Glass) film, or the like. Separating insulation film 52 electrically insulates gate electrode 63 and first electrode 61 from each other.

First electrode 61 is provided on first main surface 1. First electrode 61 is, for example, a source electrode. First electrode 61 has an electrode layer 60 and a wiring layer 64. Electrode layer 60 is composed of, for example, a material including Ti (titanium), Al (aluminum), and Si (silicon). Electrode layer 60 may include Ni (nickel). Wiring layer 64 is composed of, for example, a material including Al.

First electrode 61 is in contact with each of second impurity region 20 and third impurity region 30 on first main surface 1. Specifically, electrode layer 60 is in contact with each of first portion 41 and third impurity region 30 on first main surface 1. First electrode 61 may be disposed to extend over trench 5. First electrode 61 may cover separating insulation film 52. First electrode 61 is electrically connected to second impurity region 20. First electrode 61 is electrically connected to third impurity region 30. When first impurity region 10 has n type conductivity and second impurity region 20 has p type conductivity, first electrode 61 functions as an anode electrode.

Second electrode 62 is provided on second main surface 2. Second electrode 62 is, for example, a drain electrode. Second electrode 62 is in contact with first impurity region 10 on second main surface 2. Specifically, second electrode 62 is in contact with silicon carbide single-crystal substrate 15 on second main surface 2. Second electrode 62 is electrically connected to first impurity region 10. When first impurity region 10 has n type conductivity and second impurity region 20 has p type conductivity, second electrode 62 functions as a cathode electrode. Second electrode 62 is composed of a material capable of ohmic contact with silicon carbide single-crystal substrate 15 having n type conductivity, such as NiSi (nickel silicide).

It should be noted that in silicon carbide semiconductor device 200 according to the first embodiment, a breakdown voltage in reverse characteristic is, for example, more than or equal to 600 V, and is preferably more than or equal to 1100 V.

Next, the following describes a method of measuring the concentration of the p type impurity and the concentration of the n type impurity in each impurity region.

The concentration of the p type impurity and the concentration of the n type impurity in each impurity region can be measured using SIMS (Secondary Ion Mass Spectrometry). A measurement device is, for example, a secondary ion mass spectrometer provided by Cameca. A measurement pitch is, for example, 0.01 μm. When an n type impurity to be detected is nitrogen, a primary ion beam is cesium (Cs). A primary ion energy is 14.5 keV. A secondary ion polarity is negative. When a p type impurity to be detected is aluminum or boron, a primary ion beam is oxygen ($O_2$). A primary ion energy is 8 keV. A secondary ion polarity is positive.

Next, the following describes a method of distinguishing a p type region and an n type region from each other.

In the method of distinguishing the p type region and the n type region from each other, an SCM (Scanning Capacitance Microscope) is used. A measurement device is, for example, NanoScope IV provided by Bruker AXS. The SCM is a method of visualizing a carrier concentration distribution in a semiconductor. Specifically, a surface of a sample is scanned using a metal-coated silicon probe. On this occasion, a high-frequency voltage is applied to the sample. Majority carriers are excited to apply modulation onto the capacitance of the system. The frequency of the high-frequency voltage applied to the sample is 100 kHz and the voltage is 4.0 V.

Figure 2:
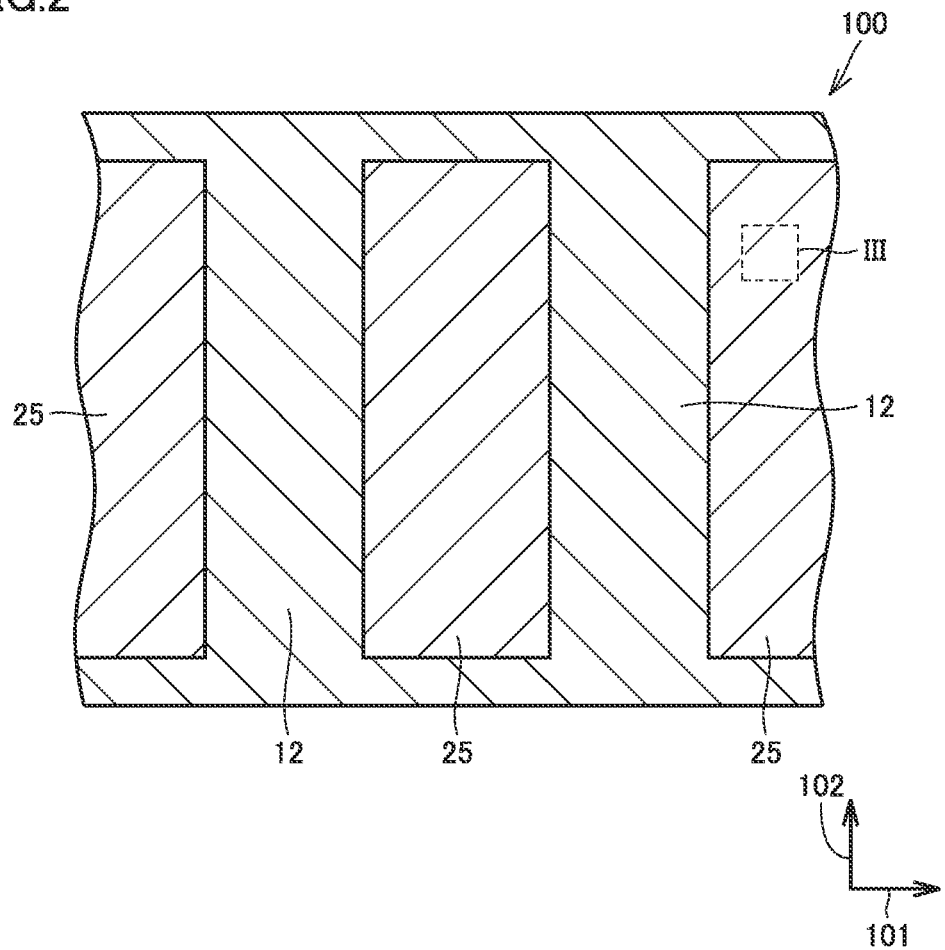
FIG. 2 is a schematic cross sectional view along a line II-II of FIG. 1.

FIG. 2 is a schematic cross sectional view along a line II-II of FIG. 1. As shown in FIG. 2, each of second super junction regions 25 extends, for example, along a second direction 102 when viewed in a direction perpendicular to second main surface 2. From another viewpoint, it can be said that the long-side direction of second super junction region 25 corresponds to second direction 102, for example. The short-side direction of second super junction region 25 corresponds to first direction 101, for example. When viewed in the direction perpendicular to second main surface 2, second super junction region 25 may have a substantially rectangular shape. When viewed in the direction perpendicular to second main surface 2, first super junction regions 12 may surround second super junction regions 25.

Each of first direction 101 and second direction 102 is parallel to second main surface 2. Third direction 103 is perpendicular to second main surface 2. First direction 101 is, for example, a <11-20> direction. Second direction 102 is, for example, a <1-100> direction. Third direction 103 is, for example, a <0001> direction. First direction 101 may be, for example, a direction obtained by projecting the <11-20> direction onto first main surface 1. Second direction 102 may be, for example, a direction obtained by projecting the <1-100> direction onto first main surface 1. Third direction 103 may be, for example, a direction inclined with respect to the <0001> direction.

Figure 3:
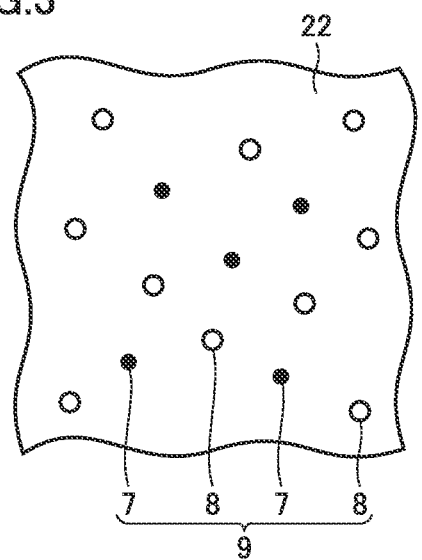
FIG. 3 is an enlarged schematic view of a region III in FIG. 2.

FIG. 3 is an enlarged schematic view of a region III in FIG. 2. As shown in FIG. 3, second region 22 has point defects 9. The energy level of point defects 9 is deeper than Ec (energy at the bottom of the conduction band) by more than or equal to 0.5 eV and is higher than Ev (energy at the top of the valence band) by more than or equal to 0.4 eV. Point defects 9 may have: first defects 7 each referred to as "$Z_{1/2}$ center"; and second defects 8 each referred to as "$EH_{6/7}$ center". The energy level of the $Z_{1/2}$ centers equals to Ec (energy at the bottom of the conduction band)–0.65 eV. The energy level of the $EH_{6/7}$ centers equals to Ec (energy at the bottom of the conduction band)–1.55 eV. Second region 22 may have both first defects 7 and second defects 8, may have only first defects 7, or may have only second defects 8.

The point defect density of second region 22 is more than or equal to $6\times10^{12}$ cm$^{-3}$. The point defect density of second region 22 may be more than or equal to $8\times10^{12}$ cm$^{-3}$, or may be more than or equal to $10\times10^{12}$ cm$^{-3}$, for example. The point defect density of second region 22 may be, for example, less than or equal to $1\times10^{14}$ cm$^{-3}$. The point defect density of second region 22 may be less than or equal to $0.8\times10^{14}$ cm$^{-3}$, or may be less than or equal to $0.6\times10^{14}$ cm$^{-3}$, for example. It should be noted that when second region 22 has first defects 7 and second defects 8, the point defect density of second region 22 is the total point defect density of first defects 7 and second defects 8.

Next, the following describes a method of measuring the point defect density.

The point defect density can be measured by a DLTS (Deep Level Transient Spectroscopy) method and/or an ICTS method (Isothermal Capacitance Transient Spectroscopy). In the DLTS method, a change in junction capacitance over time is obtained by changing a temperature with a pulse width being set to be constant. In the ICTS method, a change in junction capacitance over time is obtained by changing a pulse width with a temperature being set to be constant. Information about the point defects can be obtained by using one of the DLTS method and the ICTS method; however, the information about the point defects can be obtained more precisely by performing both the methods. As a measurement device, FT1230 provided by Phystech can be used, for example. The temperature of the sample falls within a range of 77 K to 773 K, and a pulse voltage is applied to obtain the change in junction capacitance over time. For the pulse, a voltage of +20 V to −20 V is used with a pulse width of 1 μs to 60 s being used. By performing Fourier transform or Laplace transform onto a transient change in junction capacitance, the point defect density and the energy level thereof can be obtained.

Second Embodiment

Next, a configuration of a silicon carbide semiconductor device 200 according to a second embodiment will be described. Silicon carbide semiconductor device 200 according to the second embodiment is different from silicon carbide semiconductor device 200 according to the first embodiment in terms of such a configuration that trench 5 has a U-shape, and the other configurations of silicon carbide semiconductor device 200 according to the second embodiment are the same as those of silicon carbide semiconductor device 200 according to the first embodiment. The following mainly describes the configuration different from that of silicon carbide semiconductor device 200 according to the first embodiment.

Figure 4:
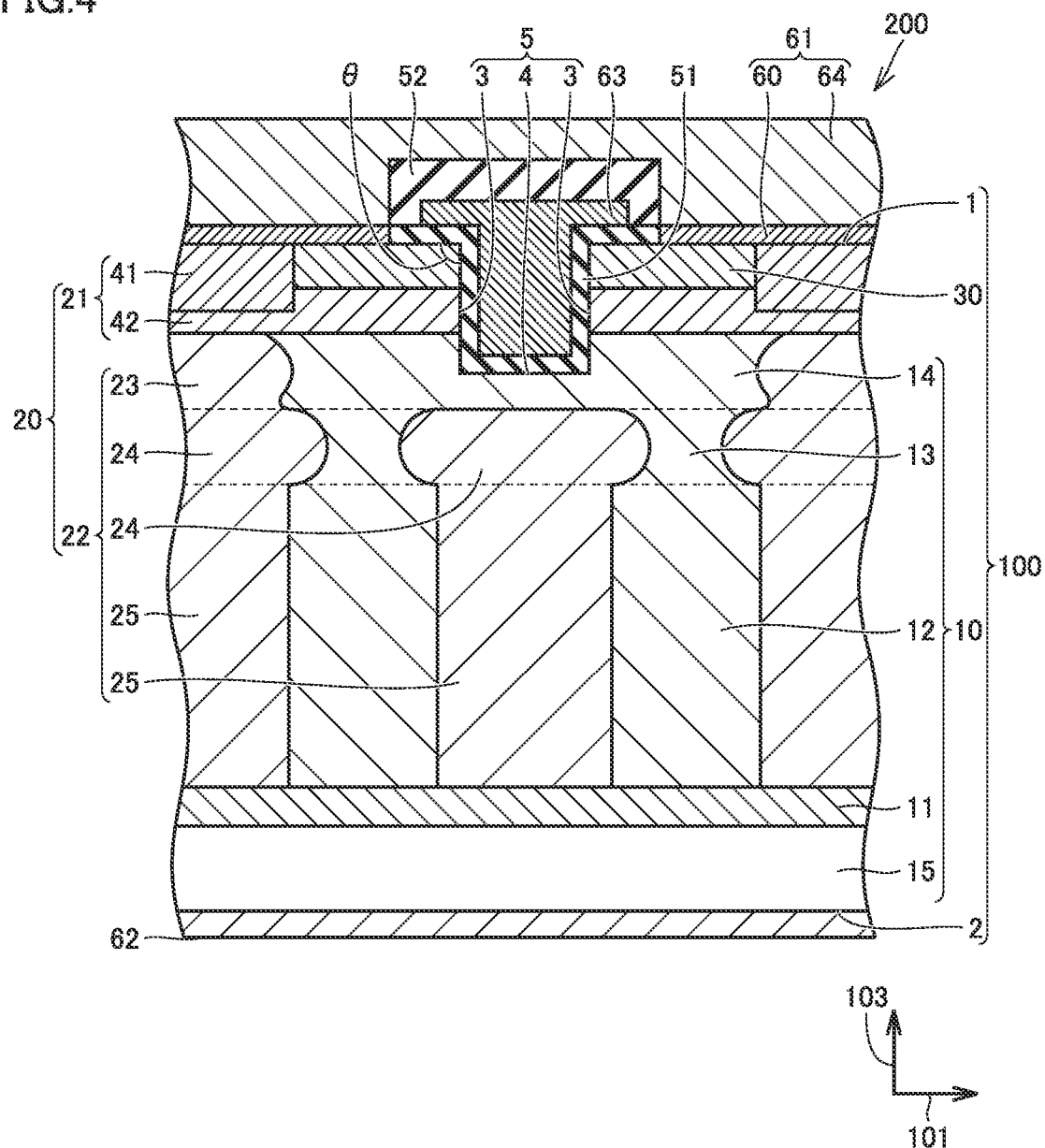
FIG. 4 is a schematic cross sectional view showing a configuration of a silicon carbide semiconductor device according to a second embodiment.

FIG. 4 is a schematic cross sectional view showing the configuration of silicon carbide semiconductor device 200 according to the second embodiment. As shown in FIG. 4, trench 5 has a U-shape in a cross section perpendicular to first main surface 1. Specifically, trench 5 has side surface 3 and bottom surface 4. Angle θ formed between first main surface 1 and side surface 3 is 90°. Side surface 3 extends substantially perpendicular to first main surface 1. Bottom surface 4 extends substantially in parallel with first main surface 1. A boundary between side surface 3 and bottom surface 4 may be rounded.

Third Embodiment

Next, a configuration of a silicon carbide semiconductor device 200 according to a third embodiment will be described. Silicon carbide semiconductor device 200 according to the third embodiment is different from silicon carbide semiconductor device 200 according to the first embodiment in terms of such a configuration that silicon carbide semiconductor device 200 according to the third embodiment is a planar type, and the other configurations of silicon carbide semiconductor device 200 according to the third embodiment are the same as those of silicon carbide semiconductor device 200 according to the first embodiment. The following mainly describes the configuration different from that of silicon carbide semiconductor device 200 according to the first embodiment.

Figure 5:
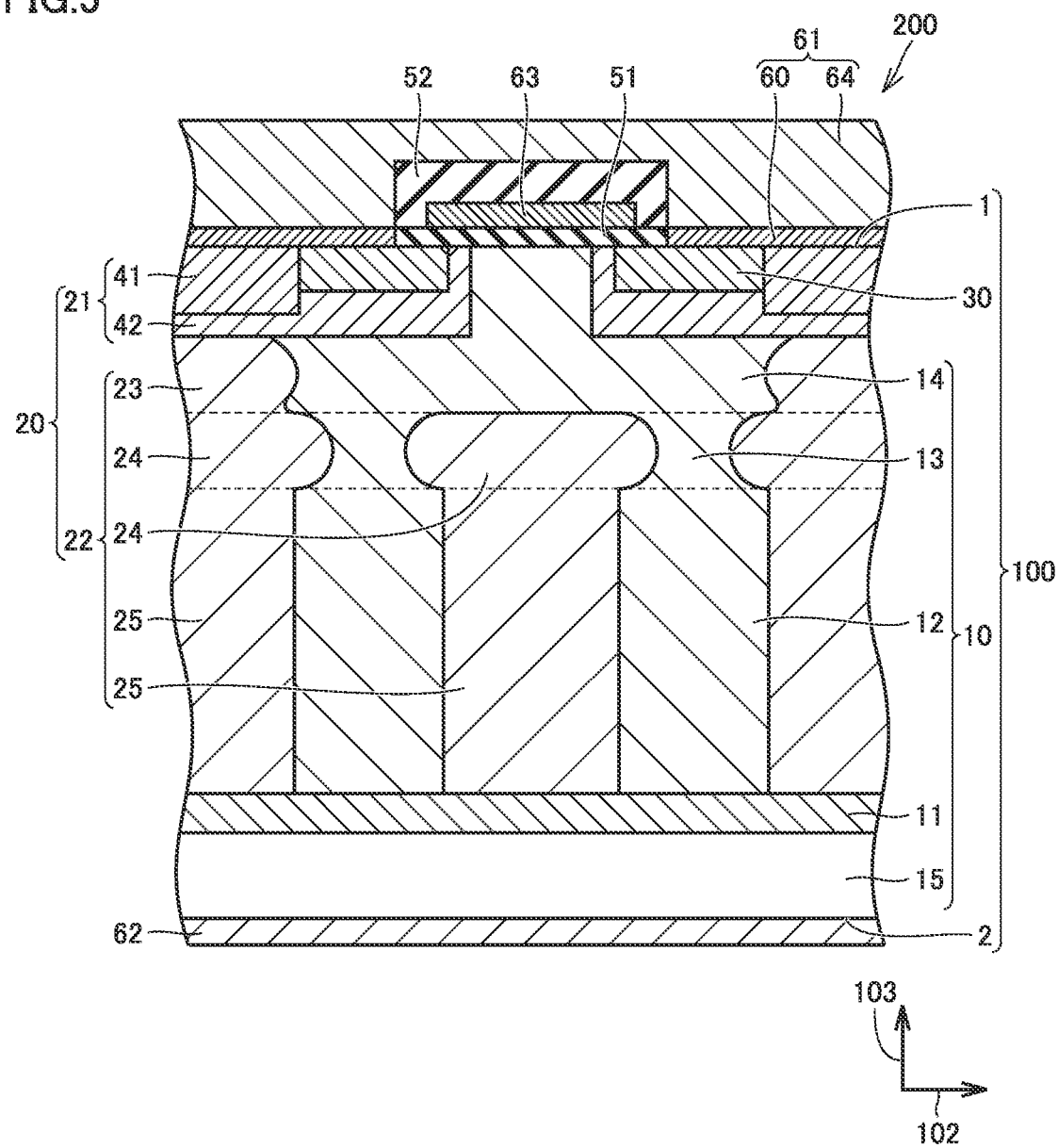
FIG. 5 is a schematic cross sectional view showing a configuration of a silicon carbide semiconductor device according to a third embodiment.

FIG. 5 is a schematic cross sectional view showing the configuration of silicon carbide semiconductor device 200 according to the third embodiment. As shown in FIG. 5, silicon carbide semiconductor device 200 according to the third embodiment is a planar type. Gate insulation film 51 is provided on first main surface 1. Gate insulation film 51 may be in contact with each of third impurity region 30, second portion 42, and current spreading region 14 on first main surface 1. Second portion 42 may constitute a portion of first main surface 1. Current spreading region 14 may constitute a portion of first main surface 1. Gate electrode 63 may face each of third impurity region 30, second portion 42, and current spreading region 14.

Method of Manufacturing Silicon Carbide Semiconductor Device

Next, a method of manufacturing the silicon carbide semiconductor device according to the present embodiment will be described.

Figure 6:
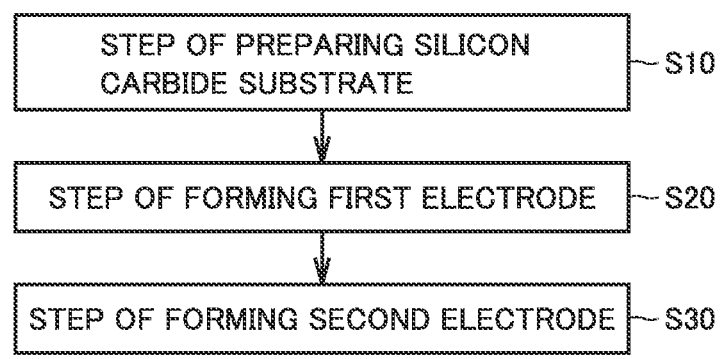
FIG. 6 is a flowchart schematically showing a method of manufacturing a silicon carbide semiconductor device according to the present embodiment.
Figure 7:
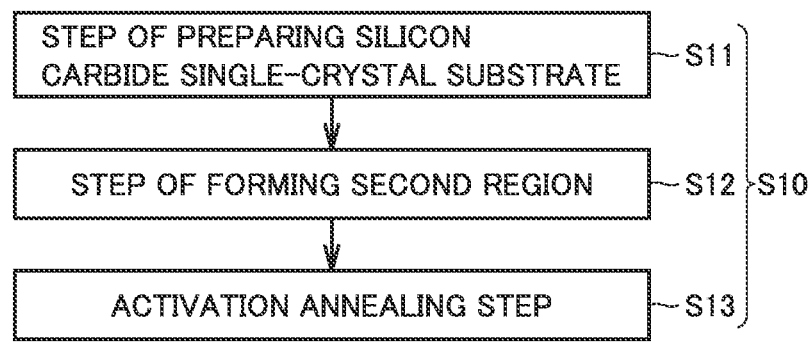
FIG. 7 is a flowchart schematically showing a step of preparing a silicon carbide substrate in the method of manufacturing the silicon carbide semiconductor device according to the present embodiment.

As shown in FIG. 6, the method of manufacturing silicon carbide semiconductor device 200 according to the present embodiment mainly includes: a step (S10: FIG. 6) of preparing a silicon carbide substrate; a step (S20: FIG. 6) of forming a first electrode; and a step (S30: FIG. 6) of forming a second electrode. As shown in FIG. 7, the step (S10: FIG. 6) of preparing the silicon carbide substrate mainly includes: a step (S11: FIG. 7) of preparing a silicon carbide single-crystal substrate; a step (S12: FIG. 7) of forming a second region; and an activation annealing step (S13: FIG. 7).

Figure 8:
FIG. 8 is a schematic cross sectional view showing a first step of the method of manufacturing the silicon carbide semiconductor device according to the present embodiment.

First, the step (S11: FIG. 7) of preparing the silicon carbide single-crystal substrate is performed. For example, a silicon carbide ingot (not shown) manufactured by a sublimation method is sliced to prepare silicon carbide single-crystal substrate 15. As shown in FIG. 8, silicon carbide single-crystal substrate 15 has a third main surface 6 and second main surface 2. Second main surface 2 is opposite to third main surface 6. The polytype of the silicon carbide of silicon carbide single-crystal substrate 15 is, for example, 4H. The polytype may be 6H, 15R, or 3C. 6H represents a hexagonal crystal. 15H represents a rhombohedral crystal. 3C represents a cubic crystal.

Figure 9:
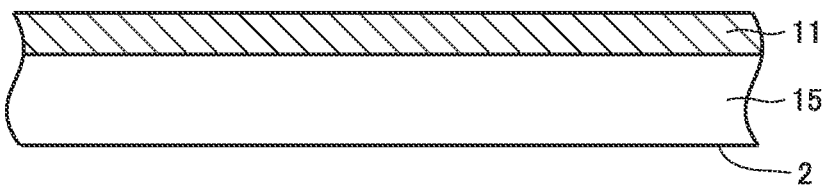
FIG. 9 is a schematic cross sectional view showing a second step of the method of manufacturing the silicon carbide semiconductor device according to the present embodiment.

Next, buffer layer 11 is formed. For example, buffer layer 11 is formed on silicon carbide single-crystal substrate 15 by a CVD (Chemical Vapor Deposition) method using a mixed gas of silane ($SiH_4$) and propane ($C_3H_8$) as a source material gas and using hydrogen ($H_2$) as a carrier gas (see FIG. 9). During epitaxial growth, an n type impurity such as nitrogen is introduced into buffer layer 11.

Figure 10:
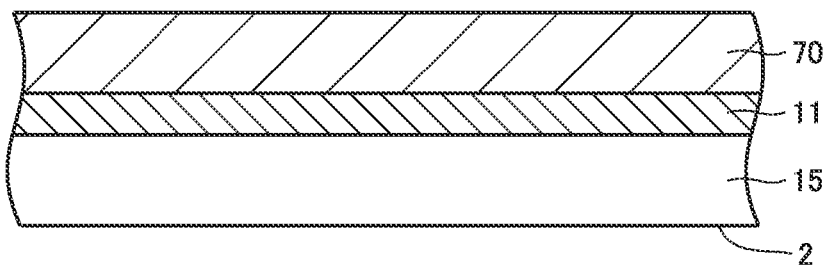
FIG. 10 is a schematic cross sectional view showing a third step of the method of manufacturing the silicon carbide semiconductor device according to the present embodiment.

Next, the step (S12: FIG. 7) of forming second region 22 is performed. For example, a first epitaxial layer 70 is formed on buffer layer 11 by a CVD method using a mixed gas of silane and propane as a source material gas and using hydrogen as a carrier gas (see FIG. 10). During epitaxial growth, an n type impurity such as nitrogen is introduced into first epitaxial layer 70. First epitaxial layer 70 has n type conductivity. The concentration of the n type impurity in first epitaxial layer 70 may be less than the concentration of the n type impurity in buffer layer 11.

Figure 11:
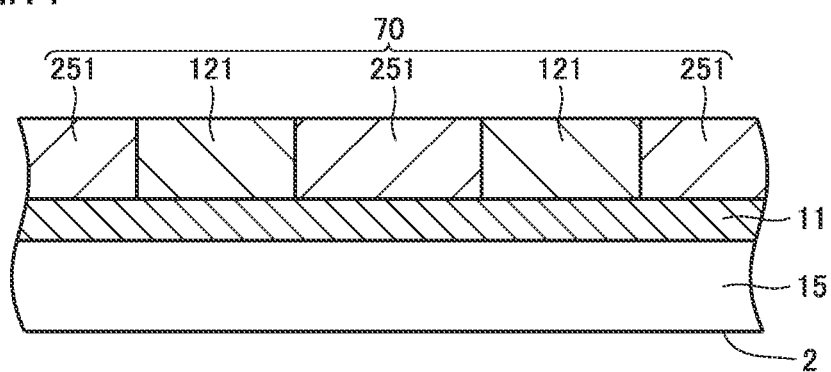
FIG. 11 is a schematic cross sectional view showing a fourth step of the method of manufacturing the silicon carbide semiconductor device according to the present embodiment.

Next, a mask layer (not shown) is formed which is provided with an opening above first epitaxial layer 70. Next, p type impurity ions that can impart p type conductivity, such as aluminum ions, are implanted into first epitaxial layer 70. Thus, first p type regions 251 are formed (see FIG. 11). In first epitaxial layer 70, regions in which no first p type regions 251 are formed are first n type regions 121. First p type regions 251 are in contact with first n type regions 121. First p type regions 251 are to become portions of second region 22.

Figure 12:
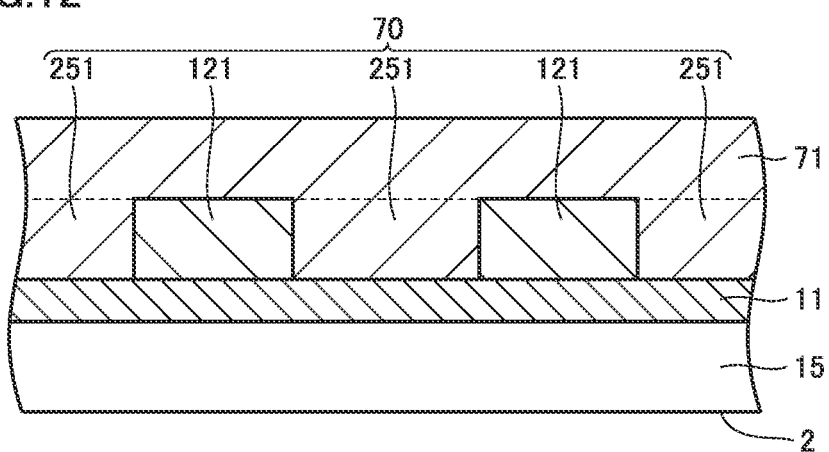
FIG. 12 is a schematic cross sectional view showing a fifth step of the method of manufacturing the silicon carbide semiconductor device according to the present embodiment.

Next, a second epitaxial layer 71 is formed. For example, second epitaxial layer 71 is formed on first epitaxial layer 70 by a CVD method using a mixed gas of silane and propane as a source material gas and using hydrogen as a carrier gas (see FIG. 12). During epitaxial growth, an n type impurity such as nitrogen is introduced into second epitaxial layer 71. Second epitaxial layer 71 has n type conductivity.

Figure 13:
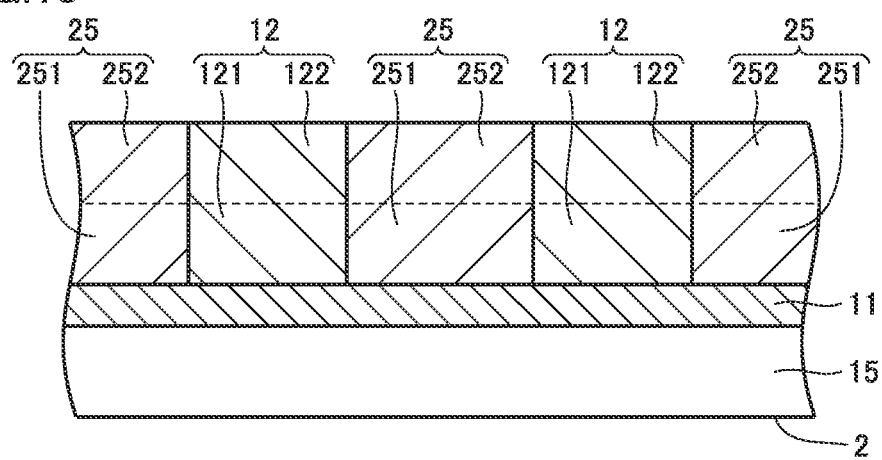
FIG. 13 is a schematic cross sectional view showing a sixth step of the method of manufacturing the silicon carbide semiconductor device according to the present embodiment.

Next, a step of implanting p type impurity ions is performed. For example, a mask layer (not shown) is formed which is provided with an opening above second epitaxial layer 71. Next, p type impurity ions that can impart p type conductivity, such as aluminum ions, are implanted into second epitaxial layer 71. Thus, second p type regions 252 are formed. Second p type regions 252 are formed to be connected to first p type regions 251 (see FIG. 13). Second p type regions 252 are to become portions of second region 22. In second epitaxial layer 71, regions in which no second p type regions 252 are formed are second n type regions 122.

As described above, the step of forming the epitaxial layer having n type conductivity and the step of implanting the p type impurity ions are alternately performed. Thus, a super junction structure having first super junction regions 12 and second super junction regions 25 is formed. By the same method, first joint regions 13, second joint regions 24, third joint regions 23, and current spreading region 14 are formed.

Second super junction regions 25, second joint regions 24, and third joint regions 23 constitute second region 22. Second region 22 is formed by ion implantation. The impurity concentration of second region 22 is more than or equal to $6 \times 10^{16}$ cm$^{-3}$. Specifically, second super junction regions 25 are formed by ion implantation. Second joint regions 24 may be formed by ion implantation. Third joint regions 23 may be formed by ion implantation. By forming the p type impurity by ion implantation, the point defect density of second region 22 becomes high.

Next, an n type epitaxial layer is formed on current spreading region 14 and third joint regions 23. P type impurity ions that can impart p type conductivity, such as aluminum ions, are implanted into the whole of the surface of the n type epitaxial layer. Thus, second portion 42 of first region 21 is formed.

Current spreading region 14, first joint regions 13, and first super junction regions 12 constitute first impurity region 10. First impurity region 10 is formed by epitaxial growth under a temperature condition of, for example, more than or equal to 1500° C. and less than or equal to 1750° C. The temperature of the epitaxial growth of first impurity region 10 may be more than or equal to 1550° C. or may be more than or equal to 1600° C., for example. The temperature of the epitaxial growth of first impurity region 10 may be less than or equal to 1725° C. or may be less than or equal to 1700° C., for example. By performing the epitaxial growth at such a high temperature, the point defect density of second region 22 becomes high.

Next, ions of an n type impurity such as phosphorus (P) are implanted into the whole of the surface of the epitaxial layer. Thus, third impurity region 30 is formed. Next, a mask layer (not shown) is formed which is provided with an opening above a region in which first portion 41 of first region 21 is to be formed. Next, p type impurity ions that can impart p type conductivity, such as aluminum ions, are implanted into third impurity region 30. Thus, first portion 41 in contact with third impurity region 30 is formed. In this way, first region 21 having first portion 41 and second portion 42 is formed. First region 21 may be formed by ion implantation. Specifically, first portion 41 may be formed by ion implantation. Similarly, second portion 42 may be formed by ion implantation.

Next, the activation annealing step (S13: FIG. 7) is performed. The activation annealing step may be performed under a temperature condition of more than or equal to 1600° C. and less than or equal to 1850° C. The temperature of the activation annealing step may be more than or equal to 1650° C. or may be more than or equal to 1700° C. The temperature of the activation annealing step may be less than or equal to 1800° C. or may be less than or equal to 1750° C. By performing the activation annealing at such a high temperature, the point defect density of second region 22 becomes high. The activation annealing is performed for about 30 minutes, for example. An atmosphere for the activation annealing is preferably an inert gas atmosphere such as an Ar atmosphere.

Figure 14:
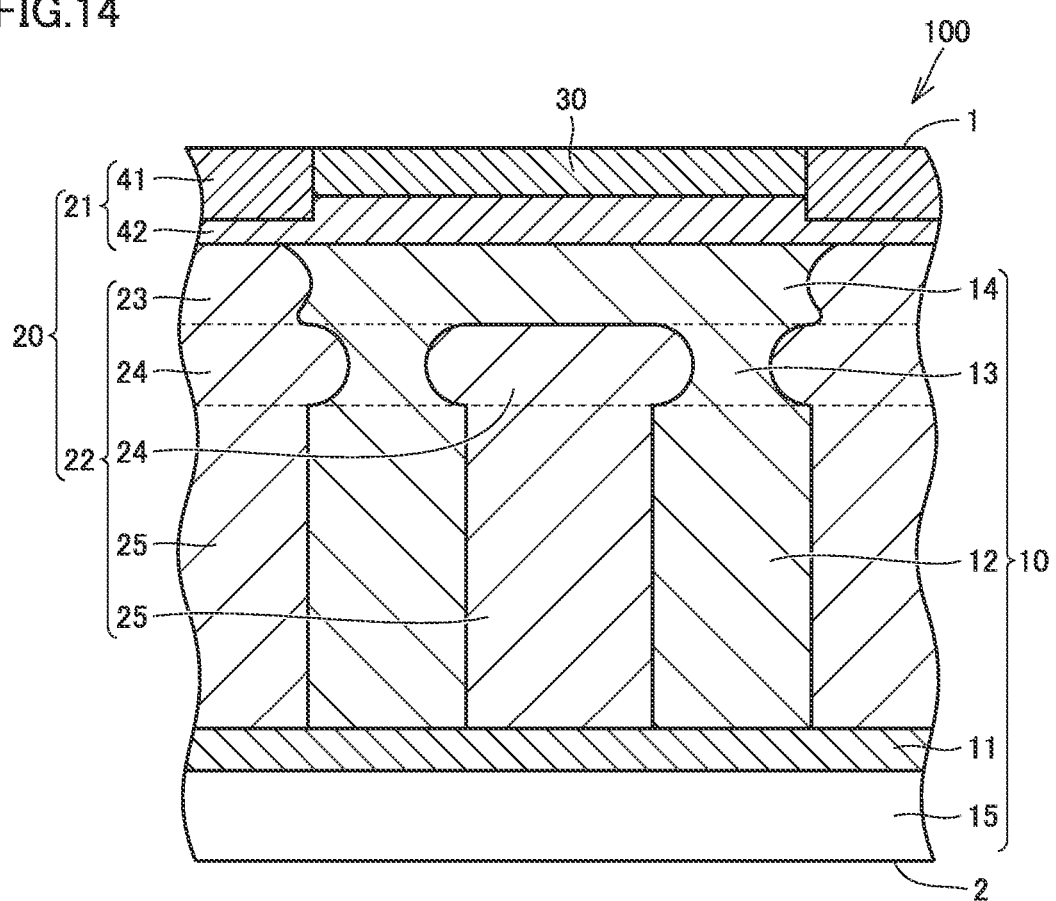
FIG. 14 is a schematic cross sectional view showing a seventh step of the method of manufacturing the silicon carbide semiconductor device according to the present embodiment.

As described above, silicon carbide substrate 100 is prepared. Silicon carbide substrate 100 has first main surface 1, second main surface 2, first impurity region 10, second impurity region 20, and third impurity region 30. Second main surface 2 is opposite to first main surface 1. First impurity region 10 constitutes at least a portion of second main surface 2 and has the first conductivity type. Second impurity region 20 constitutes at least a portion of first main surface 1, is provided in contact with first impurity region 10, and has the second conductivity type different from the first conductivity type. Third impurity region 30 is provided in contact with second impurity region 20 so as to be separated from first impurity region 10 and has the first conductivity type. Second impurity region 20 includes first region 21 and second region 22. Second region 22 is disposed between first region 21 and second main surface 2 and is in contact with first region 21 (see FIG. 14).

Next, a step of forming trench 5 is performed. For example, a mask (not shown) is formed on first main surface 1 constituted of third impurity region 30 and first portion 41. A portion of third impurity region 30, a portion of second portion 42, and a portion of current spreading region 14 are removed by etching using the mask. As an etching method, for example, reactive ion etching, particularly, inductively coupled plasma reactive ion etching can be used. Specifically, for example, inductively coupled plasma reactive ion etching using sulfur hexafluoride ($SF_6$) or a mixed gas of $SF_6$ and oxygen ($O_2$) as a reaction gas can be used. By the etching, a recess is formed in a region in which trench 5 is to be formed, so as to have a side portion substantially perpendicular to first main surface 1 and a bottom portion provided to be continuous to the side portion and substantially parallel to first main surface 1.

Next, thermal etching is performed in the recess. The thermal etching may be performed by performing heating in an atmosphere including a reactive gas having at least one type of halogen atoms in a state in which a mask is formed on first main surface 1, for example. The at least one type of halogen atoms include at least either of chlorine (Cl) atoms and fluorine (F) atoms. The atmosphere includes, for example, chlorine ($Cl_2$), boron trichloride ($BCl_3$), $SF_6$ or carbon tetrafluoride ($CF_4$). For example, the thermal etching is performed by using a mixed gas of chlorine gas and oxygen gas as a reaction gas and setting a heat treatment temperature to, for example, more than or equal to 800° C. and less than or equal to 900° C. It should be noted that the reaction gas may include a carrier gas in addition to the chlorine gas and the oxygen gas described above. As the carrier gas, for example, nitrogen gas, argon gas, helium gas, or the like can be used.

Figure 15:
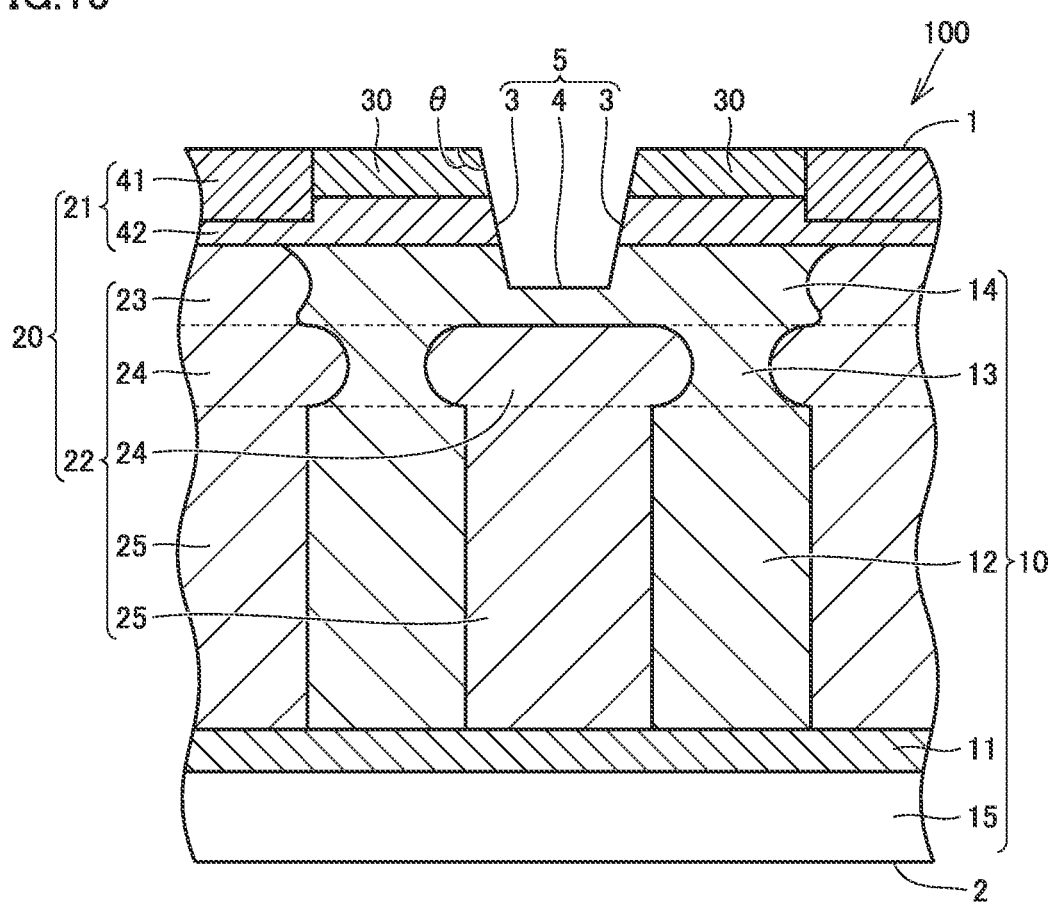
FIG. 15 is a schematic cross sectional view showing an eighth step of the method of manufacturing the silicon carbide semiconductor device according to the present embodiment.

By the thermal etching, trench 5 is formed in first main surface 1 of silicon carbide substrate 100 (see FIG. 15). Trench 5 has side surface 3 and bottom surface 4. Side surface 3 is constituted of third impurity region 30, second portion 42, and current spreading region 14. Bottom surface 4 is constituted of current spreading region 14. Angle θ formed between first main surface 1 and side surface 3 is, for example, more than or equal to 115° and less than or equal to 135°. Next, the mask is removed from first main surface 1.

Next, a step of forming gate insulation film 51 is performed. For example, silicon carbide substrate 100 is thermally oxidized to form gate insulation film 51 in contact with third impurity region 30, second portion 42, current spreading region 14 and first portion 41. Specifically, silicon carbide substrate 100 is heated in an atmosphere including oxygen at a temperature of, for example, more than or equal to 1300° C. and less than or equal to 1400° C. Thus, gate insulation film 51 in contact with first main surface 1, side surface 3 and bottom surface 4 is formed.

Next, silicon carbide substrate 100 may be subjected to heat treatment (NO annealing) in a nitrogen monoxide (NO) gas atmosphere. In the NO annealing, silicon carbide substrate 100 is held under a condition of more than or equal to 1100° C. and less than or equal to 1400° C. for about 1 hour, for example. Thus, nitrogen atoms are introduced into an interface region between gate insulation film 51 and second portion 42. As a result, formation of interface states in the interface region can be suppressed, thereby improving channel mobility.

After the NO annealing, Ar annealing using argon (Ar) as an atmosphere gas may be performed. A heating temperature in the Ar annealing is, for example, more than or equal to the heating temperature in the NO annealing. The Ar annealing is performed for about 1 hour, for example. Thus, formation of interface states in the interface region between gate insulation film 51 and second portion 42 is further suppressed. It should be noted that as the atmosphere gas, another inert gas such as nitrogen gas may be used instead of the Ar gas.

Next, a step of forming gate electrode 63 is performed. Gate electrode 63 is formed on gate insulation film 51. Gate electrode 63 is formed by, for example, an LP-CVD (Low Pressure Chemical Vapor Deposition) method. Gate electrode 63 is formed to face each of third impurity region 30, second portion 42, and current spreading region 14.

Next, a step of forming separating insulation film 52 is performed. Specifically, separating insulation film 52 is formed to cover gate electrode 63 and to be in contact with gate insulation film 51. Separating insulation film 52 is formed by, for example, a CVD method. Separating insulation film 52 is, for example, a material including silicon dioxide. A portion of separating insulation film 52 may be formed inside trench 5.

Next, the step (S20: FIG. 6) of forming the first electrode is performed. For example, etching is performed to form an opening in separating insulation film 52 and gate insulation film 51, with the result that third impurity region 30 and first portion 41 are exposed from separating insulation film 52 and gate insulation film 51 in the opening. Next, electrode layer 60 in contact with third impurity region 30 and first portion 41 on first main surface 1 is formed. Electrode layer 60 is formed by, for example, a sputtering method. Electrode layer 60 is composed of a material including Ti, Al, and Si, for example.

Next, alloying annealing is performed. Electrode layer 60 in contact with third impurity region 30 and first portion 41 is held at a temperature of, for example, more than or equal to 900° C. and less than or equal to 1100° C. for about 5 minutes. Thus, at least a portion of electrode layer 60 reacts with silicon included in silicon carbide substrate 100, thus resulting in silicidation. Thus, electrode layer 60 in ohmic contact with third impurity region 30 is formed. Electrode layer 60 may be in ohmic contact with first portion 41. In this way, first electrode 61 in contact with each of second impurity region 20 and third impurity region 30 on first main surface 1 is formed.

Next, the step (S30: FIG. 6) of forming the second electrode is performed. For example, second electrode 62 is formed on second main surface 2 by a sputtering method. Second electrode 62 is, for example, a drain electrode. Second electrode 62 is in contact with first impurity region 10 on second main surface 2. Second electrode 62 is composed of, for example, a material including NiSi or TiAlSi. Thus, MOSFET 200 (FIG. 1) according to the first embodiment is completed.

It should be noted that in the description above, it has been illustrated that the first conductivity type corresponds to n type conductivity and the second conductivity type corresponds to p type conductivity; however, the first conductivity type may correspond to p type conductivity and the second conductivity type may correspond to n type conductivity. In this case, when reading the description, the p type impurity should be replaced with the n type impurity, and the n type impurity should be replaced with the p type impurity. Further, in the description above, silicon carbide semiconductor device 200 according to the present disclosure has been described by illustrating the MOSFET; however, silicon carbide semiconductor device 200 according to the present disclosure is not limited to the MOSFET. Silicon carbide semiconductor device 200 according to the present disclosure may be, for example, a PN diode, an IGBT (Insulated Gate Bipolar Transistor), or the like.

EXAMPLES

Preparation of Samples

Next, examples will be described. First, a silicon carbide semiconductor device 200 according to a sample 1 and a silicon carbide semiconductor device 200 according to a sample 2 were prepared. Silicon carbide semiconductor device 200 according to sample 1 was a V-shaped trench MOSFET having a super junction structure. Specifically, silicon carbide semiconductor device 200 according to sample 1 was the V-shaped trench MOSFET according to the first embodiment. In silicon carbide semiconductor device 200 according to sample 1, the concentration of the p type impurity in second super junction region 25 was $1\times10^{17}$ $cm^{-3}$, and the concentration of the p type impurity in the channel region (second portion 42) was $2\times10^{18}$ $cm^{-3}$. In silicon carbide semiconductor device 200 according to sample 1, a characteristic on-resistance was 0.63 mΩcm² and a breakdown voltage was 1170 V. Silicon carbide semiconductor device 200 according to sample 2 was a V-shaped trench MOSFET having no super junction structure. In silicon carbide semiconductor device 200 according to sample 2, the concentration of the p type impurity in the channel region (second portion 42) was $1\times10^{16}$ $cm^{-3}$.

Evaluation Method

Next, a diode characteristic between the drain electrode (second electrode 62) and the source electrode (first electrode 61) was measured. Specifically, a drain current density was measured while changing a drain voltage under a plurality of temperature conditions. In silicon carbide semiconductor device 200 according to sample 1, the temperature conditions were 25° C., 50° C., 75° C., 100° C., 125° C., 150° C., and 175° C. In silicon carbide semiconductor device 200 according to sample 2, the temperature conditions were 25° C., 93° C., 122° C., and 162° C.

Evaluation Results

Figure 16:
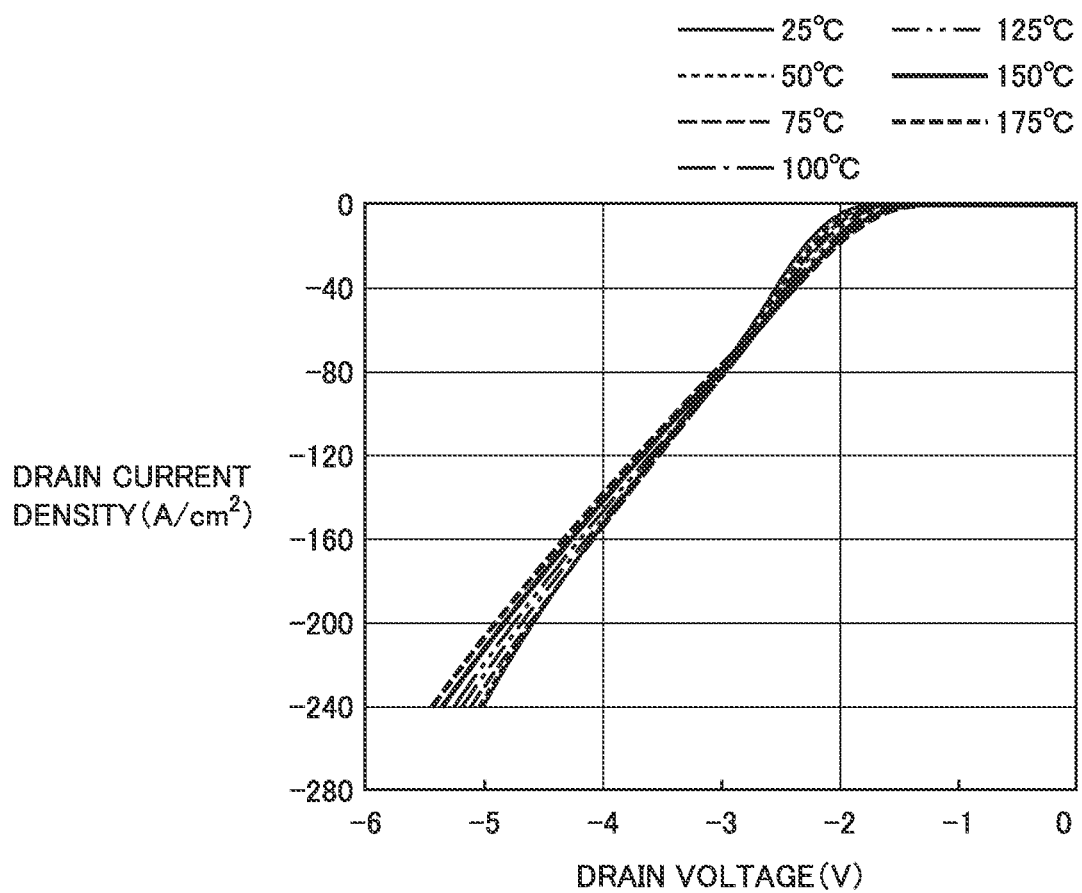
FIG. 16 is a diagram showing a relation between a drain current density and a drain voltage in a silicon carbide semiconductor device according to a sample 1.
Figure 17:
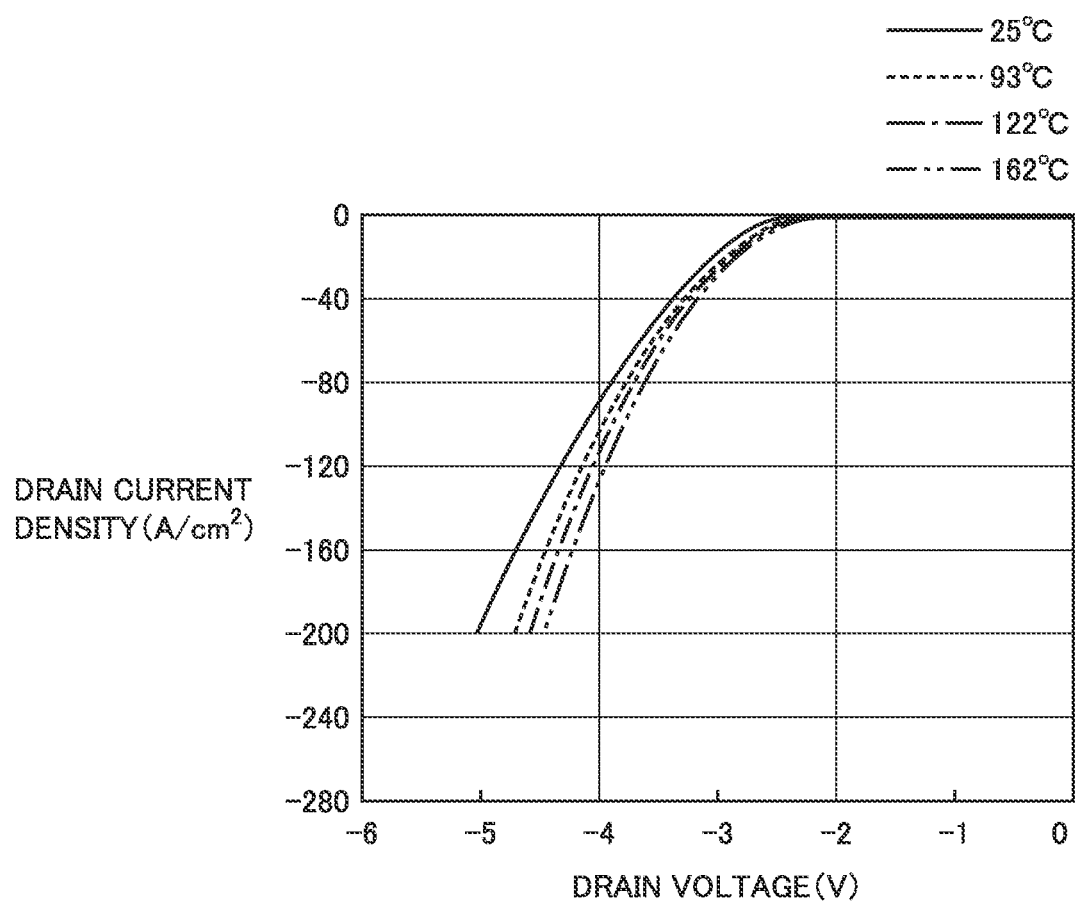
FIG. 17 is a diagram showing a relation between a drain current density and a drain voltage in a silicon carbide semiconductor device according to a sample 2.

FIG. 16 is a diagram showing a relation between the drain current density and the drain voltage in silicon carbide semiconductor device 200 according to sample 1. FIG. 17 is a diagram showing a relation between the drain current density and the drain voltage in silicon carbide semiconductor device 200 according to sample 2. As shown in FIG. 17, in silicon carbide semiconductor device 200 according to sample 2, the inclination of the drain current density with respect to the drain voltage became larger as the temperature was increased. On the other hand, as shown in FIG. 16, in silicon carbide semiconductor device 200 according to sample 1, the inclination of the drain current density with respect to the drain voltage was not changed much even when the temperature was increased. That is, it was confirmed that in silicon carbide semiconductor device 200 according to sample 1, the diode characteristic could be suppressed from being changed by a temperature as compared with silicon carbide semiconductor device 200 according to sample 2.

It should be noted that basal plane dislocations present in silicon carbide substrate 100 may become stacking faults due to energy of recombination of minority carriers. When silicon carbide semiconductor device 200 has such stacking faults, the breakdown voltage of silicon carbide semiconductor device 200 is significantly decreased. In order to avoid the recombination of the minority carriers, it is desirable to reduce the minority carriers. The small change in diode characteristic by temperature (that is, small change in resistance by temperature) as in silicon carbide semiconductor device 200 according to sample 1 means that substantially no conductivity modulation has occurred. Therefore, it is considered that in silicon carbide semiconductor device 200 according to sample 1, there are a very small number of minority carriers. Therefore, in silicon carbide semiconductor device 200 according to sample 1, the following additional effect can be expected: generation of stacking faults is suppressed, thereby suppressing a decreased breakdown voltage.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 3: side surface; 4: bottom surface; 5: trench; 6: third main surface; 7: first defect; 8: second defect; 9: point defect; 10: first impurity region; 11: buffer layer; 12: first super junction region; 13: first joint region; 14: current spreading region; 15: single-crystal substrate; 20: second impurity region; 21: first region; 22: second region; 23: third joint region; 24: second joint region; 25: second super junction region; 30: third impurity region; 41: first portion; 42: second portion; 51: gate insulation film; 52: separating insulation film; 60: electrode layer; 61: first electrode; 62: second electrode; 63: gate electrode; 64: wiring layer; 70: first epitaxial layer; 71: second epitaxial layer; 100: silicon carbide substrate; 101: first direction; 102: second direction; 103: third direction; 121: first n type region; 122: second n type region; 200: silicon carbide semiconductor device (MOSFET); 251: first p type region; 252: second p type region.

The invention claimed is:
1. A silicon carbide semiconductor device comprising:
a silicon carbide substrate having a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impu- rity region so as to be separated from the first impurity region, the third impurity region having the first conductivity type;
a first electrode in contact with each of the second impurity region and the third impurity region on the first main surface;
a gate electrode; and
a second electrode in contact with the first impurity region on the second main surface, wherein
the second impurity region includes a first region and a second region disposed between the first region and the second main surface and in contact with the first region,
an impurity concentration of the first region is more than or equal to $6 \times 10^{16}$ cm$^{-3}$,
when a drain current density is measured while changing a drain voltage under a temperature condition of 25° C. to 175° C., an inclination of the drain current density with respect to the drain voltage becomes smaller as a temperature is increased, and
the second region having a super junction region formed to face the gate electrode.

2. The silicon carbide semiconductor device according to claim 1, wherein an impurity concentration of the second region is more than or equal to $6 \times 10^{16}$ cm$^{-3}$.

3. The silicon carbide semiconductor device according to claim 1, wherein the silicon carbide semiconductor device is a planar type.

4. The silicon carbide semiconductor device according to claim 1, wherein
a trench is provided in the silicon carbide substrate, and
the trench has a side surface in contact with each of the first impurity region, the second impurity region, and the third impurity region, and a bottom surface contiguous to the side surface and in contact with the first impurity region.

5. The silicon carbide semiconductor device according to claim 4, wherein in a cross section perpendicular to the first main surface, the trench has a U-shape.

6. The silicon carbide semiconductor device according to claim 4, wherein in a cross section perpendicular to the first main surface, the trench has a V-shape.

7. The silicon carbide semiconductor device according to claim 1, wherein the first main surface is a (000-1) plane or a plane inclined at an angle of less than or equal to 8° with respect to the (000-1) plane.

8. The silicon carbide semiconductor device according to claim 1, wherein the impurity concentration of the first region is more than an impurity concentration of the second region.

9. The silicon carbide semiconductor device according to claim 8, wherein the impurity concentration of the first region is less than or equal to $1 \times 10^{19}$ cm$^{-3}$.

10. The silicon carbide semiconductor device according to claim 1, wherein when the temperature is increased from 25° C. to 175° C., an amount of change of the inclination of the drain current density with respect to the drain voltage is less than or equal to 20 A/(cm$^2 \times$V).

11. The silicon carbide semiconductor device according to claim 1, wherein the second region has a joint region disposed on the super junction region, and in a short-side direction of the super junction region, a maximum width of the joint region is larger than a width of the super junction region.

12. The silicon carbide semiconductor device according to claim 1, wherein the super junction region has a first doped region and a second doped region each having the second conductivity type, and
the first doped region is formed to face the gate electrode and the second doped region is formed not to face the gate electrode.

13. A silicon carbide semiconductor device comprising:
a silicon carbide substrate having a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impurity region so as to be separated from the first impurity region, the third impurity region having the first conductivity type;
a first electrode in contact with each of the second impurity region and the third impurity region on the first main surface;
a gate electrode; and
a second electrode in contact with the first impurity region on the second main surface, wherein
the second impurity region includes a first region and a second region disposed between the first region and the second main surface and in contact with the first region,
a point defect density of the first region is more than or equal to $6 \times 10^{12}$ cm$^{-3}$,
when a drain current density is measured while changing a drain voltage under a temperature condition of 25° C. to 175° C., an inclination of the drain current density with respect to the drain voltage becomes smaller as a temperature is increased, and
the second region has a super junction region formed to face the gate electrode.

14. The silicon carbide semiconductor device according to claim 13, wherein the point defect density of the first region is less than or equal to $1 \times 10^{14}$ cm$^{-3}$.

15. The silicon carbide semiconductor device according to claim 13, wherein the silicon carbide semiconductor device is a planar type.

16. The silicon carbide semiconductor device according to claim 13, wherein
a trench is provided in the silicon carbide substrate, and
the trench has a side surface in contact with each of the first impurity region, the second impurity region, and the third impurity region, and a bottom surface contiguous to the side surface and in contact with the first impurity region.

17. The silicon carbide semiconductor device according to claim 16, wherein in a cross section perpendicular to the first main surface, the trench has a U-shape.

18. The silicon carbide semiconductor device according to claim 16, wherein in a cross section perpendicular to the first main surface, the trench has a V-shape.

19. The silicon carbide semiconductor device according to claim 13, wherein the first main surface is a (000-1) plane or a plane inclined at an angle of less than or equal to 8° with respect to the (000-1) plane.

20. The silicon carbide semiconductor device according to claim 13, wherein the impurity concentration of the first region is more than an impurity concentration of the second region.

21. The silicon carbide semiconductor device according to claim 20, wherein the impurity concentration of the first region is less than or equal to $1 \times 10^{19}$ cm$^{-3}$.

22. The silicon carbide semiconductor device according to claim 13, wherein when the temperature is increased from 25° C. to 175° C., an amount of change of the inclination of the drain current density with respect to the drain voltage is less than or equal to 20 A/(cm$^2 \times$V).

23. A method of manufacturing a silicon carbide semiconductor device, the method comprising:

preparing a silicon carbide substrate having a first main surface, a second main surface, a first impurity region, a second impurity region, and a third impurity region, the second main surface being opposite to the first main surface, the first impurity region constituting at least a portion of the second main surface, the first impurity region having a first conductivity type, the second impurity region constituting at least a portion of the first main surface, the second impurity region being provided in contact with the first impurity region, the second impurity region having a second conductivity type different from the first conductivity type, the third impurity region being provided in contact with the second impurity region so as to be separated from the first impurity region, the third impurity region having the first conductivity type;

forming a first electrode in contact with each of the second impurity region and the third impurity region on the first main surface;

forming a gate electrode; and forming a second electrode in contact with the first impurity region on the second main surface, wherein the second impurity region includes a first region and a second region disposed between the first region and the second main surface and in contact with the first region, an impurity concentration of the first region is more than or equal to $6 \times 10^{16}$ cm$^{-3}$, the first region is formed by ion implantation, when a drain current density is measured while changing a drain voltage under a temperature condition of 25° C. to 175° C., an inclination of the drain current density with respect to the drain voltage becomes smaller as a temperature is increased, and the second region has a super junction formed to face the gate electrode.

24. The method of manufacturing the silicon carbide semiconductor device according to claim 23, wherein the second region is formed by ion implantation.

25. The method of manufacturing the silicon carbide semiconductor device according to claim 23, wherein the first impurity region is formed by epitaxial growth under a temperature condition of more than or equal to 1500° C. and less than or equal to 1750° C.

26. The method of manufacturing the silicon carbide semiconductor device according to claim 23, wherein the preparing of the silicon carbide substrate includes performing activation annealing, and the performing of the activation annealing is performed under a temperature condition of more than or equal to 1600° C. and less than or equal to 1850° C.

27. The silicon carbide semiconductor device according to claim 23, wherein when the temperature is increased from 25° C. to 175° C., an amount of change of the inclination of the drain current density with respect to the drain voltage is less than or equal to 20 A/(cm$^2 \times$V).

* * * * *